(12) United States Patent  (10) Patent No.: US 7,005,921 B2
McCalmont                     (45) Date of Patent:     Feb. 28, 2006

(54) COMMON-MODE FEEDBACK CIRCUIT

(75) Inventor: Jonathan Scott McCalmont, Ames, IA (US)

(73) Assignee: Micrel, Incorporated, San Jose, CA (US)

( * ) Notice: Subject to any disclaimer, the term of this patent is extended or adjusted under 35 U.S.C. 154(b) by 112 days.

(21) Appl. No.: 10/802,677

(22) Filed: Mar. 17, 2004

(65) Prior Publication Data

US 2005/0206453 A1   Sep. 22, 2005

(51) Int. Cl.
  *H03F 3/45*   (2006.01)
(52) U.S. Cl. .................. 330/259; 330/258; 330/257
(58) Field of Classification Search ............... 330/257, 330/258, 259
   See application file for complete search history.

(56) References Cited

U.S. PATENT DOCUMENTS

| 4,568,885 | A | * | 2/1986  | McKenzie et al. | 330/253 |
| 5,321,370 | A | * | 6/1994  | Yukawa          | 330/258 |
| 5,410,274 | A | * | 4/1995  | Birdsall et al. | 330/265 |
| 5,847,601 | A | * | 12/1998 | Wang            | 330/9   |
| 6,087,897 | A | * | 7/2000  | Wang            | 330/9   |

* cited by examiner

*Primary Examiner*—Patricia Nguyen
(74) *Attorney, Agent, or Firm*—Ladas & Parry LLP

(57) ABSTRACT

A common-mode feedback circuit is provided for fully-differential operational amplifier stages of a multistage amplifier. A first stage of the circuit establishes a substantially constant current output level for a feedback generating stage of the circuit. An exemplary embodiment using MOSFET devices illustrates using a diode-connected MOSFET and mirror MOSFET first stage and a generating the current for a common-source connected MOSFET second stage connected to the respective outputs for said fully-differential operational amplifier. An output stage of the circuit provides feedback voltage at a first level when inputs to said fully-differential operational amplifier are in equilibrium and at a second level for balancing said fully-differential operational amplifier when inputs to said fully-differential operational amplifier are not in equilibrium.

10 Claims, 3 Drawing Sheets

US 7,005,921 B2

COMMON-MODE FEEDBACK CIRCUIT

(2) CROSS-REFERENCE TO RELATED APPLICATIONS

Not applicable.

(3) STATEMENT REGARDING FEDERALLY SPONSORED RESEARCH OR DEVELOPMENT

Not applicable.

(4) REFERENCE TO AN APPENDIX

Not applicable.

(5) BACKGROUND

1. Technical Field

The technology described herein is generally related to the field of integrated circuits ("IC") and, more particularly to operational amplifier circuits.

2. Description of Related Art

Two-stage complementary-metal-oxide-silicon ("CMOS") operational amplifier ("op-amp") circuits are ubiquitous in electronic circuit design, providing relatively high voltage gain, very high input impedance, very low output impedance, and good rejection of common-mode signals (two signal voltages of the same phase, frequency and amplitude on the inputs). One class of CMOS op-amp circuits has a differential input and a single output. FIG. 1A (Prior Art) illustrates a basic, two-stage, differential op-amp. In CMOS IC implementations, two or more differential amplifier stages are used where the gain of each stage is frequency dependent; the response of a multistage op-amp is a composite of the individual responses of the internal stages.

One problem with two-stage CMOS op-amp circuits is an inability to both source and sink a large current to the output. For example, consider a CMOS op-amp where the first stage, input, devices are p-channel metal-oxide-silicon field-effect-transistors ("MOSFET") and the second stage consists of a p-channel pull-up device that provides a constant bias current and an n-channel pull-down device in a common-source gain configuration. As such, the current that can be sourced from the positive power supply to the output is limited to the bias current in the p-channel device. The current that can be sunk from the output to the negative power supply (or ground) is greater, due to the gain of the common-source configuration. Conversely, an op-amp with n-channel inputs can source large currents but can only sink up to the bias current in the output stage. In general it is undesirable to increase the output current capability by increasing the bias currents as that would lead to large standby mode power dissipation.

Common-mode feedback has been used in an operational amplifier having differential inputs and differential outputs wherein a predetermined common-mode output voltage independent of common-mode input voltage and input voltage variation is provided. U.S. Pat. No. 4,573,020, Feb. 25, 1886, by Whatley, for a FULLY DIFFERENTIAL OPERATIONAL AMPLIFIER WITH D.C. COMMON-MODE FEEDBACK, uses D.C. common-mode feedback to provide a common-mode output voltage of the differential operational amplifier.

(6) BRIEF SUMMARY

The present invention generally provides for an improved, common-mode feedback circuit.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

(7) BRIEF DESCRIPTION OF THE DRAWINGS

Like reference designations represent like features throughout the drawings. The drawings in this specification should be understood as not being drawn to scale unless specifically annotated as such.

(8) DETAILED DESCRIPTION

Figure 1A:
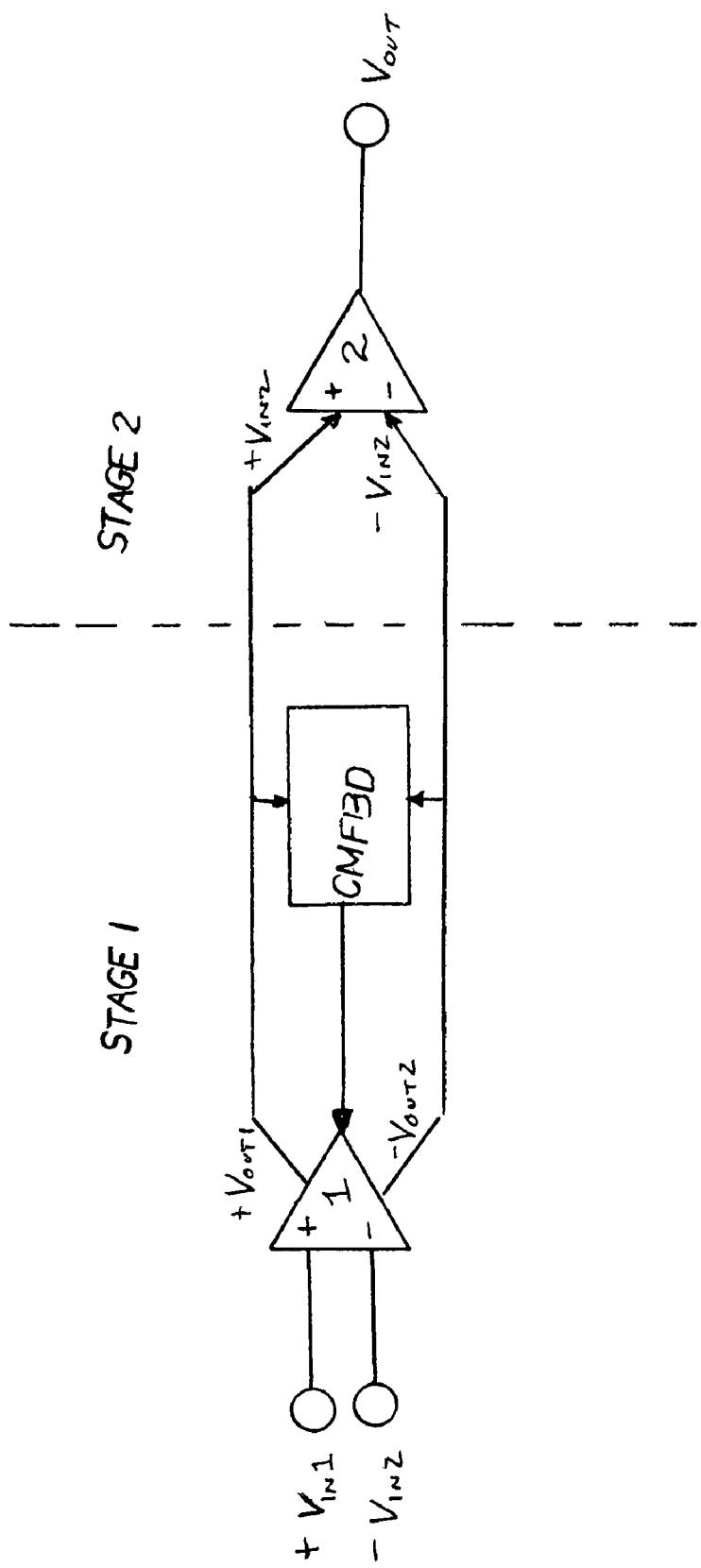
FIG. 1A (PRIOR ART) is a schematic block diagram of a two-stage differential amplifier.

The op-amp in its basic form typically consists of two or more differential amplifier stages. Using conventional symbols, FIG. 1A (Prior Art) shows a two-stage op-amp. The first stage, "STAGE 1," is a fully-differential amplifier OP-AMP 1, having two inputs, a non-inverting input "+$Vin_1$," an inverting input "–$Vin_1$," and respective outputs "+$Vout_1$," "–$Vout_1$," and a common-mode feedback device "CMFBD." The second stage, "STAGE 2," OP-AMP 2, has inputs "+$Vin_2$," "–$Vin_2$" connected respectively to the outputs +$Vout_1$, –$Vout_1$ of STAGE 1 and a single output "Vout."

Figure 1B:
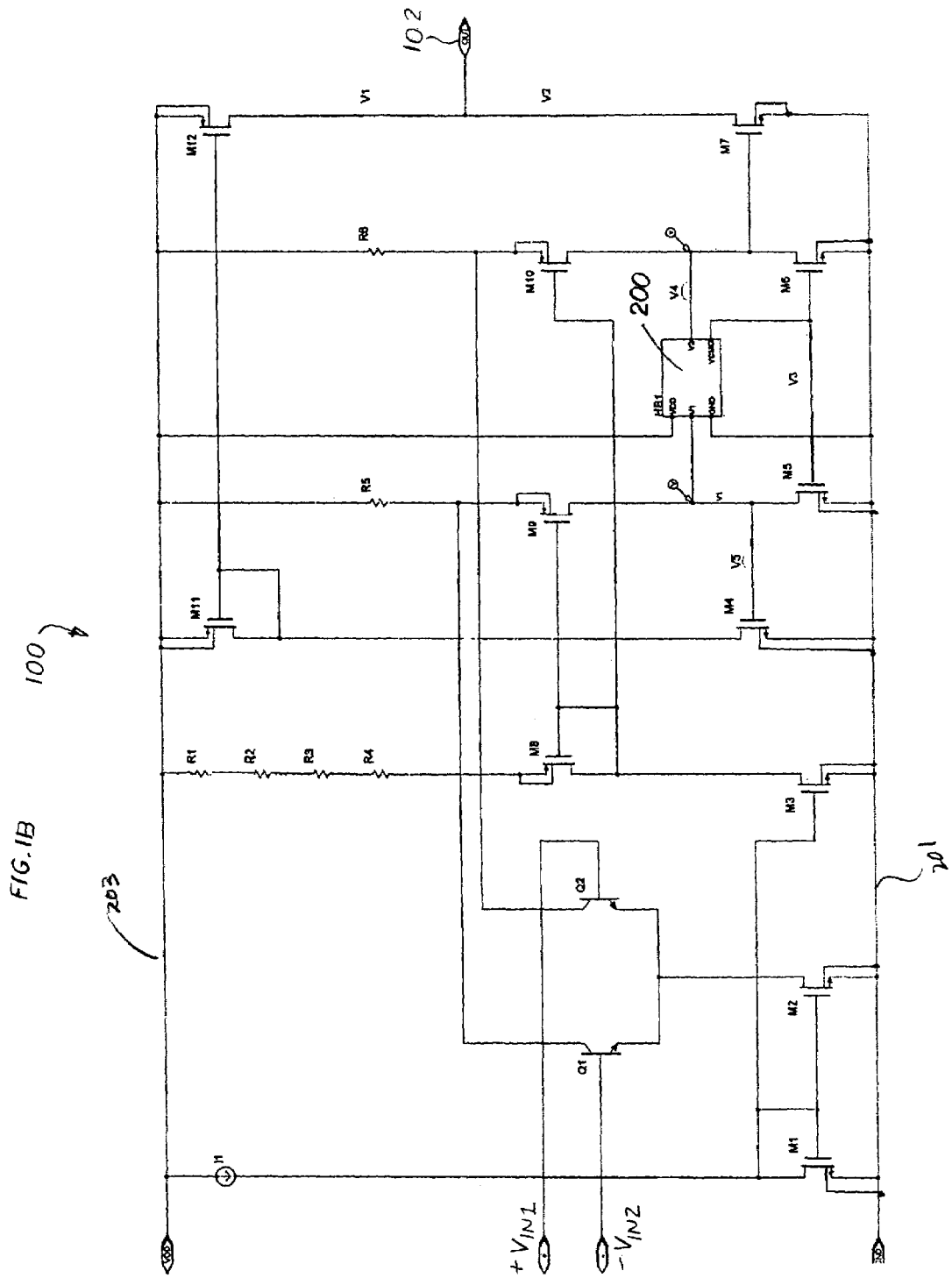
FIG. 1B is an electrical circuit diagram of an exemplary implementation of a two-stage differential amplifier employing the present invention.

FIG. 1B is a schematic diagram of an exemplary BiCMOS embodiment for a circuit implementing a two-stage op-amp device incorporating a common-mode feedback device to be described in depth with respect to FIG. 2 hereinafter. This is a type of exemplary two-stage differential amplifier that is able to both source and sink a large current at its output OUT 102. This exemplary circuit 100 is a folded-cascode, fully-differential input stage class op-amp followed by a push-pull, single-ended output stage class op-amp. It will be noted by those skilled in the art that a pair of bipolar input transistors Q1, Q2 form the differential pair input stage. Four MOSFETs M1, M2, M3, and M8 establish bias currents. Resistors R5 and R6 provide a load for the input transistors Q1, Q2. A pair of MOSFETs M9, M10 are cascode devices. A pair of MOSFETs M5, M6 provide an active load for the output. The differential output signals V1(+), V2(–) of the differential input stage are at the drain terminals of the active load MOSFETs M5, M6 respectively. The push-pull single-ended output stage comprises a first pair of MOSFETs M7, M12. A second pair of MOSFETs M4, M11 mirror the output signal at the drain of MOSFET M5 around to the gate of MOSFET M12.

As the first stage is a fully-differential op-amp in that both the input and output signals are differential, a CMFB device HB1 is required on the first stage output to set the DC level of the outputs to be at a reference voltage potential between the two power supply rails 201, 203 potentials, e.g., a VDD potential and ground, GND, (or other secondary supply potential depending on the implementation) when a differential voltage is applied to the inputs of STAGE 1.

Figure 2:
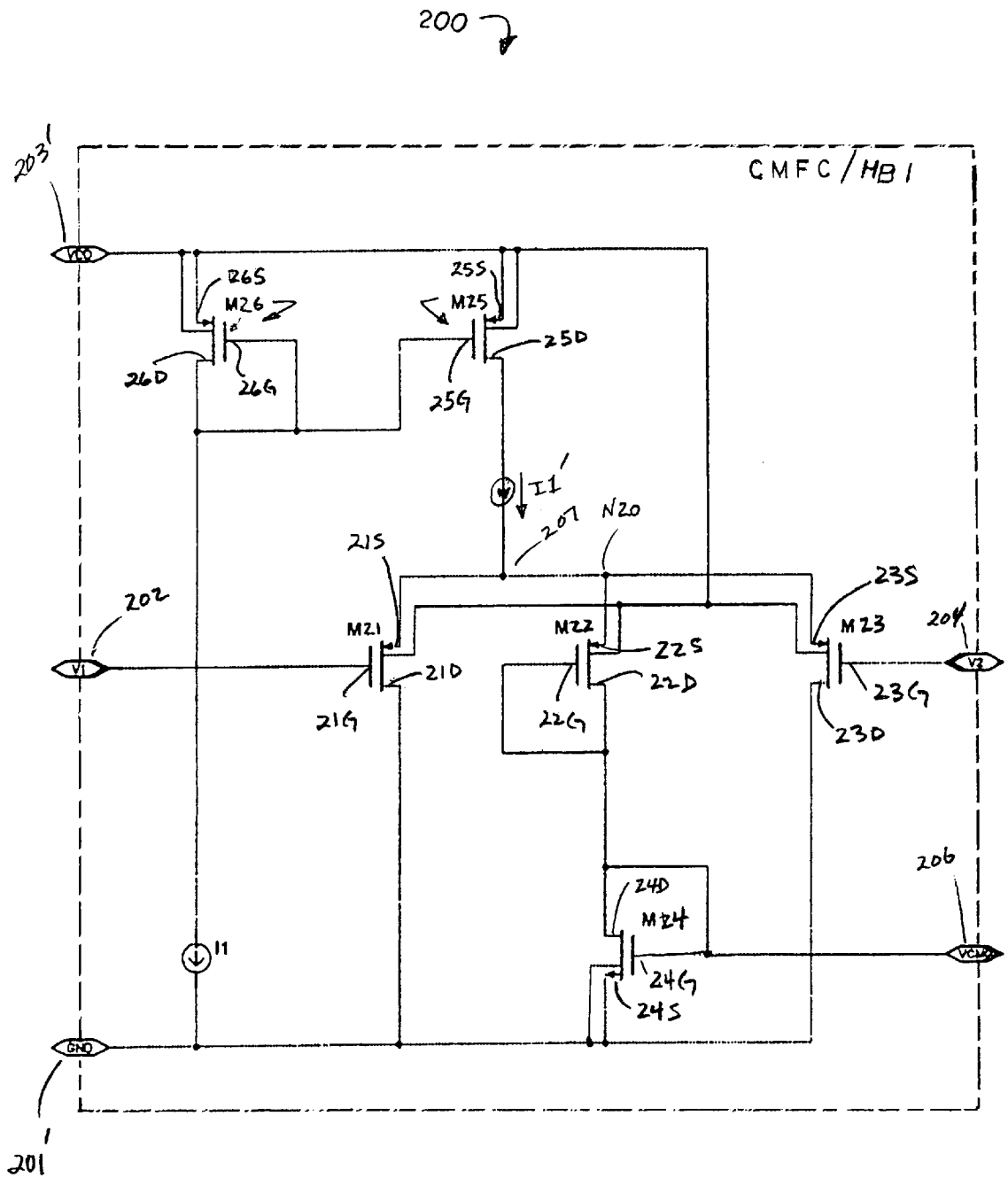
FIG. 2 is an exemplary embodiment of a common-mode feedback device in accordance with the present invention as may be employed in a two-stage differential amplifier as shown in FIG. 1B.

An improved common-mode feedback circuit HB1 which may be employed with the circuit 100 of FIG. 1B is shown in FIG. 2. FIG. 2 illustrates an exemplary implementation of a common-mode feedback circuit device, CMFC/HB1 200, in accordance with the present invention that has significant advantages over known manner CMFBD circuits such as shown by Whatley, supra. Reference to both FIGURES is made in the following detailed description of an exemplary structure of the present invention.

In the CMFC/HB1 200, first pair of n-channel MOSFETs M21, M23 receives the differential output voltages V1, V2 (see also FIG. 1A, "+Vout1," "– Vout2") from the first stage of the amplifier 100 at respective CMFC input terminal ports 202, 204. MOSFET M21 has a gate region 21G connected to the CMFC input terminal port 202 for receiving the first output voltage V1 of the amplifier 100 first stage, FIG. 1B. MOSFET M21 has a drain region 21D connected by a CMFC input terminal port 201' to one power supply rail 201, GND, of the amplifier 100. The source 21S of MOSFET M21 is connected to the source 23S of the second MOSFET M23. The gate 23G of MOSFET M23 is connected to the CMFC input terminal port 204 and thus to the second output voltage V2 of the first stage of the amplifier 100. The drain 23D of MOSFET M23 is connected to the power supply rail 201, GND.

A third input terminal port 203' to the CMFB 200 supplies power supply voltage VDD from power supply rail 203 to the CMFB through a second pair of n-channel MOSFETs M25, M26 by being connected to and thereby biasing the respective source regions 25S, 26S. The gate regions 25G, 26G are connected to each other and to the drain region 26D of MOSFET M26. The drain region 25D of MOSFET M25 is connected to the source regions 21S, 23S of the V1-V2 receiving MOSFETs M21, M23, respectively.

A third pair of MOSFETs M22, M24 provide a CMFB output level "Vcmo" as DC common-mode feedback to the amplifier 100 via its first stage MOSFET M6. A n-channel MOSFET M22 has its source region 22S connected to the source regions 21S, 23S of the V1/V2 input MOSFETs M21, M23, respectively. MOSFET M22 has a body region connected to the body regions of MOSFETs M21 and M23. Note that in this particular implementation, the substrate is p-type and p-channel FETs are formed in an n-well body region. While the exemplary embodiment(s) described herein is illustrative of using semiconductor devices having a specific transistor polarity implementation, it will be recognized by those skilled in the art that an implementation of reverse polarity devices can be made. No limitation on the scope of the invention is intended by the exemplary embodiment(s) and none should be implied therefrom. The drain region 22D of MOSFET M22 is gate coupled. The drain region 22D of MOSFET M22 is also connected to the drain region 24D and gate 24G of a p-channel 24S of MOSFET M24 is connected to the GND rail 201. The gate region 24G is connected to the drain region 24D and Vcmo output.

Compared to devices such as taught by Whatley, this exemplary common-mode feedback device of the present invention eliminates several devices, combines others, and reduces the total power supply current required for operation while still providing a DC common-mode output voltage Vcmo for the over all op-amp (FIG. 1B) functionality at the necessary level for operation of its push-pull output stage.

Referring again to both FIGS. 1B and 2, operation of the present invention will be described. Assume initially that the amplifier 100 is in a steady-state condition with no differential signal applied. In this case, a CMFC/HB1 200 will also be in a steady-state condition; currents through transistors M21, M22 and M23 are matched according to their geometric size ratios.

For example, when transistors M21, M22 and M23 are substantially identical in size, if the drain current of transistor M21 is "I," then the drain current of transistor M22, which is geometrically equal to two transistors identical to M21, would be twice "I" or "2I." The drain current of transistor M23 would be "I," the same as the current in transistor M21. Because of the well-known characteristics of FETs, this will cause the gate-to-source voltage of the three FET devices M21, M22 and M23 to be equal. With their source terminals 21S, 22S, 23S all connect to the same node N20, the gate voltage of each FET M21, M22 and M23 will be equal. FET M22 therefore sets a reference voltage established by the gate-to-source voltage of FET M24, and the CMFC HB1 input terminal ports 202, 204, voltages "V1" and "V2," respectively, will be forced to a voltage equal to this reference.

In a first stage of the CMFC HB1 200, the FET M26 is "diode-connected." A common current source circuit—not shown, but represented here as an ideal current by symbol "I1"—is connected to the drain 26D and gate 26G of FET M26. The current source circuit is effectively a bias current which would be known in the art to be established by any number of circuits such as a band gap reference circuit. Current I1 pulls down on the gate 26G and drain 26D, establishing a voltage on the gate that is a function of the current. FET M25 is a "mirror FET" with the same connects of its gate 25G and source 25S as FET M26. Therefore, the current out of the drain 25D of FET M25 will tend to be equal to the current in FET M26 which is I1. Thus, a current I1' out of the drain 25D of FET M25 flows into the node 207 connected to source regions M21S, M23 of HB1 second stage and source region M22 of the HB1 third stage of the CMFC/HB1 200. Thus, the output of the first stage is at a level such that it drives a common-source second stage. The third stage FETs M22, M24 coupled to the second as described above thus provide the proper aforementioned Vcmo output.

Now assume that this equilibrium state is disturbed by a differential input signal +Vin1, –Vin2 to the amplifier 100. The voltage at CMFC/HB1 200 input 202 "V1" will, for example, decrease while the voltage at CMFC/HB1 200 input 204 "V2" will, for example, increase. As a result of these changes, the drain current in FET M21 will increase and the drain current in FET M22 will decrease, but the equilibrium point of the CMFC/HB1 200 is not affected. The circuit is still balanced as long as the total current through FET M21 and FET M23, determined by summing the individual drain current of each device, is equal to the drain current of FET M22. In this case the common-mode feedback circuit does not affect the overall operation of the amplifier 100.

Note that when a differential signal of the opposite polarity—such that the voltage at CMFC/HB1 200 input 202 "V1" increases and the voltage at CMFC/HB1 200 input 204 "V2" decreases—would also produce the same result.

If the equilibrium state is disturbed by a common-mode change such that the voltage at CMFC/HB1 200 input 202 "V1" and the voltage at CMFC/HB1 200 input 204 "V2"

both change in the same direction, then the feedback circuit will operate to restore the amplifier 100 to equilibrium. For example, suppose that both CMFC inputs 202, 204 "V1" and "V2," respectively, decrease in voltage. Transistors M21 and M23 will attempt to increase the amount of current flowing through them. Since the current available to the three FETs M21, M22 and M23 is fixed at "I1" by the bias device M25, the increase in current through FETs M21 and M23 causes a corresponding decrease in the current flowing through FET M22. This reduced current causes the reference voltage "Vcmo" formed by the gate-to-source voltage of device M24 to also decrease. The reference voltage "Vcmo" is then supplied to the amplifier circuit 100 first stage through CMFC/HB1 200 output terminal port 206.

It can now be recognized that externally to the common-mode feedback circuit 200, the amplifier 100 will respond in a known manner to the output "Vcmo" to increase the voltages at input terminals 202 and 203 "V1" and "V2" respectively. The CMFC/HB1 200 circuitry is brought back into equilibrium, where the current through M21 and M23 is equal, and the current through M22 is twice that value.

The above analysis can be extended to the case where the common-mode imbalance is caused by both CMFC inputs 202, 204 wherein "V1" and "V2" are increasing in voltage.

It will be understood that while a two-stage amplifier has been used as an exemplary embodiment, the concept can be readily adapted to implementations having more stages.

Moreover, it will be understood by those skilled in the art that the concept of the present invention can be readily adapted to implementations using bipolar technology, BiCMOS technology, and the like integrated circuit design and fabrication processes.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. For example, while the exemplary embodiment(s) described herein is illustrative of using semiconductor devices having a specific transistor polarity implementation, it will be recognized by those skilled in the art that an implementation of reverse polarity devices can be made. No limitation on the scope of the invention is intended by the exemplary embodiment(s) and none should be implied therefrom. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . "

What is claimed is:

1. A common-mode feedback circuit for a fully-differential operational amplifier device, the circuit comprising:
    a first power supply input terminal for connecting to a first voltage potential;
    a second power supply input terminal for connecting to a second voltage potential;
    a first input terminal for connecting to a non-inverting output of said fully-differential operational amplifier device;
    a second input terminal for connecting to an inverting output of said fully-differential operational amplifier device;
    an output terminal for providing a common-mode feedback voltage;
    bridging said first power supply terminal Vdd and said second power supply input terminal, first means for establishing a substantially constant bias current;
    connected to said first means, to said first input terminal and said second input terminal, and to said second power supply input terminal, second means for changing division of said substantially constant bias current when signals to said first input terminal and said second input terminal are not in equilibrium;
    bridging said first power supply input terminal and said second power supply input terminal and connected to said first means and said second means, third means for setting common-mode feedback voltage level at said output terminal, and
    wherein said bias current is shared between said second means and said third means such that when inverting output and non-inverting output of said fully-differential operational amplifier device are not in equilibrium said bias current through said third means is changed via said second means wherein said third means provides said common-mode feedback reference voltage at a level for re-balancing said fully-differential operational amplifier device.

2. The circuit as set forth in claim 1 wherein said first means comprises:
    a first MOSFET and a second MOSFET, wherein
        respective source regions are connected to said first power supply input terminal,
        respective gate regions are connected to a drain region of said first MOSFET,
        said first MOSFET drain region is connected to a bias current supply, and
        said second MOSFET drain region is connected to said second means.

3. The circuit as set forth in claim 2 wherein said second means comprises:
    a third MOSFET having a gate region connected to said first input terminal, a source region connected to said drain region of said second MOSFET, and a drain region connected to said second power supply input terminal, and a fourth MOSFET having a gate region connected to said second input terminal, a source region connected to said drain region of said second MOSFET, and a drain region connected to said second power supply input terminal, and wherein respective body regions of said third MOSFET and said fourth MOSFET are connected to said first power supply input terminal.

4. The circuit as set forth in claim 3 wherein said third means comprises:
a fifth MOSFET having a source region connected to said third MOSFET source region and to said fourth MOSFET source region, a gate region and a drain region co-connected, and a body region connected to said first power supply input terminal, and
a sixth MOSFET having a source region and body region connected to said second power supply input terminal, a drain region and a gate region co-connected to said co-connected gate region and drain region of said fifth MOSFET, and said sixth MOSFET gate region is connected to said output terminal.

5. A multistage operational amplifier, comprising:
at least one fully-differential operational amplifier stage; and,
bridging outputs of each said fully-differential operational amplifier stage, a common-mode feedback device including first means for providing a substantially constant current and second means, having a common-source connected input configuration, for dividing said current and for generating a feedback voltage to said fully-differential operational amplifier dependent upon division of said current therethrough such that feedback voltage is at a first level when inputs to said fully-differential operational amplifier are in equilibrium and at a second level for balancing said fully-differential operational amplifier when inputs to said fully-differential operational amplifier are not in equilibrium.

6. The invention as set forth in claim 5 wherein said first means further comprises:
a diode-connected MOSFET connected to a mirror MOSFET connected to a third MOSFET and a fourth MOSFET having said common-source connected input configuration.

7. The invention as set forth in claim 6 wherein said second means further comprises:
a MOSFET output stage generating said feedback voltage to said fully-differential operational amplifier dependent upon division of said current therethrough from said third MOSFET and said fourth MOSFET such that said feedback voltage is at said first level when inputs to said fully-differential operational amplifier are in equilibrium and at said second level for balancing said fully-differential operational amplifier when inputs to said fully-differential operational amplifier are not in equilibrium.

8. The invention as set forth in claim 7 wherein said MOSFET output stage further comprises:
a series connected fifth MOSFET and sixth MOSFET wherein said fifth MOSFET is source-connected to said fourth MOSFET and outputs of said fully-differential operational amplifier and said sixth MOSFET provides said feedback voltage at said first level when inputs to said fully-differential operational amplifier are in equilibrium and at said second level for balancing said fully-differential operational amplifier when inputs to said fully-differential operational amplifier are not in equilibrium.

9. A common-mode feedback circuit device for a fully-differential operational amplifier, the circuit comprising:
a first MOSFET configuration for maintaining a substantially constant current to an output thereof; and
connected to said output and to respective outputs of said fully-differential operational amplifier, a second MOSFET configuration for dividing said current and driving a third MOSFET configuration connected thereto, wherein said third MOSFET configuration is generating a feedback voltage to said fully-differential operational amplifier dependent upon division of said current therethrough such that feedback voltage is at a first level when inputs to said fully-differential operational amplifier are in equilibrium and at a second level for balancing said fully-differential operational amplifier when inputs to said fully-differential operational amplifier are not in equilibrium.

10. The device as set forth in claim 9, said fully-differential operational amplifier having a non-inverting output and an inverting output, said device further comprising:
a first power supply input terminal for connecting to a first power supply voltage level;
a second power supply input terminal for connecting to a second power supply voltage level;
a first input terminal for connecting to said non-inverting output of said fully-differential operational amplifier device;
a second input terminal for connecting to said inverting output of said fully-differential operational amplifier device;
an output terminal for providing a common-mode feedback voltage;
a first MOSFET and a second MOSFET, wherein respective source regions are connected to said first power supply input terminal, respective gate regions are connected to a drain region of said first MOSFET, said first MOSFET has a drain region connected to a bias current supply, and said second MOSFET has a drain region connected to said second means;
a third MOSFET having a gate region connected to said first input terminal, a source region connected to said drain region of said second MOSFET, and a drain region connected to said second power supply input terminal;
a fourth MOSFET having a gate region connected to said second input terminal, a source region connected to said drain region of said second MOSFET, and a drain region connected to said second power supply input terminal; and wherein respective body regions of said third MOSFET and said fourth MOSFET are connected to said first power supply input terminal;
a fifth MOSFET having a source region connected to said third MOSFET source region and to said fourth MOSFET source region, a gate region and a drain region co-connected, and a body region connected to said first power supply input terminal; and
a sixth MOSFET having a source region and body region connected to said second power supply input terminal, a drain region and a gate region co-connected to said co-connected gate region and drain region of said fifth MOSFET, and said sixth MOSFET gate region is connected to said output terminal.

* * * * *